United States Patent [19]
Tsuji et al.

[11] Patent Number: 5,308,995
[45] Date of Patent: May 3, 1994

[54] SEMICONDUCTOR STRAINED SL APD APPARATUS

[75] Inventors: Shinji Tsuji, Hidaka; Hitoshi Nakamura, Tsukui, both of Japan

[73] Assignee: Hitachi, Ltd., Tokyo, Japan

[21] Appl. No.: 910,480

[22] Filed: Jul. 8, 1992

[30] Foreign Application Priority Data

Jul. 12, 1991 [JP] Japan .................. 3-172176

[51] Int. Cl.$^5$ ........................ H01L 27/14
[52] U.S. Cl. ........................ 257/17; 257/18; 257/21; 257/186
[58] Field of Search .......... 257/21, 184, 186, 187, 257/438, 17, 18, 19

[56] References Cited

FOREIGN PATENT DOCUMENTS

| | | |
|---|---|---|
| 60-160191 | 8/1985 | Japan . |
| 61-224469 | 10/1986 | Japan . |
| 62-291184 | 12/1987 | Japan ............... 257/21 |
| 63-232377 | 9/1988 | Japan . |
| 3-16276 | 1/1991 | Japan . |
| 4372178 | 12/1992 | Japan . |

OTHER PUBLICATIONS

Gershoni et al., "Strained-Layer $Ga_{1-x}In_xAs$/In P Avalanche Photodetectors," Appl. Phys. Lett. 53 (14), Oct. 3, 1988, pp. 1294–1296.

Das et al., "Performance Characteristics of InGaAs/GaAs and GAs/InGaAlAs Coherently Strained Superlattice Photodiodes," Appl. Phys. Lett. 51(15), Oct. 12, 1987, pp. 1164–1165.

Kagawa et al. "Superlattice Avalanche Photodiode For High Bit Rate Optical Transmission Systems," Third Optoelectronics Conference (Dec. '90), Technical Digest, Jul. 1990, Makuhari Messe, pp. 194–195.

Capasso et al., "New Avalanche Multiplication Phenomenon in Quantum Well Superlattices: Evidence fo Impact Ionization Across The Band-Edge Discontinuity," Appl. Phys. Lett. 48(19), May 12, 1986, pp. 1294–1296.

"Superlattice Avalance Photodiode for High Bit Rate Optical Transmission Systems", Toshiaki Kagawa and Mitsuru Naganuma, Third Optoelectronics Conference (OEC '90), Technical Digest, Jul. 1990, Makuhari Messe, pp. 194–195.

Primary Examiner—William Mintel
Attorney, Agent, or Firm—Kenyon & Kenyon

[57] ABSTRACT

By making the lattice constant of barrier layers of a superlattice avalanche photodiode lower than the lattice constant of well layers to apply a tensile stress to the barrier layers, a high gain-bandwidth product can be obtained with a high ionization rate ratio kept.

7 Claims, 2 Drawing Sheets

SEMICONDUCTOR STRAINED SL APD APPARATUS

BACKGROUND OF THE INVENTION

The present invention relates to a photodiode to be used for optical communication. More specifically, the invention relates to a superlattice avalanche photodiode (SLAPD) to be used for a multi Gb/s transmission system, furthermore an avalanche photodiode having a particularly modified superlattice structure.

As s photodiode to be used for a Gb/s band optical communication system, an avalanche photodiode (hereinafter abbreviated to SLAPD) comprising a multiplication layer having a superlattice structure is now under development from a view point of wide bandwidth and low noise characteristics. A superlattice used for SLAPDs comprises a crystal layer wherein lattice are matched on a crystalline substrate. The typical structure thereof is that the well layer thickness (Lw) is 20 to 50 nm, the barrier layer thickness (Lb) is 20 to 50 nm, and the total film thickness (Lt) of the superlattice layer is about 1 μm. Kagawa and others report that characteristics of a SLAPD of the above structure are that the gain-bandwidth product (GB product) is 50 GHz, the ionization rate ratio k is 10 (when the multiplication factor M is 10). (T. Kagawa, et al; Third Optoelectronics Conference (OEC 1990), Technical Digest, 13A2-7, pp. 194 and 195, July 1990, Makuhari Messe)

Avalanche photodiodes and quantum well structures are mentioned, for example, in Japanese Patent Laid-Open Nos. 60-160191, 61-224469, 63-232377, and 3-16276.

To apply the superlattice avalanche photodiode SLAPD to future high speed optical communication systems, it is desirable to increase the gain-bandwidth product (GB product more than 100 GHz when the multiplication factor M is 10) much more with the high ionization rate ratio k (for example, k is 5 to 10 when the multiplication factor M is 10) kept. When the ionization rate ratio k is low, noise increases and the response speed slows down. In a high speed optical signal receiver, the noise power of the receiver increases because the band of the preamplifier becomes wider and it is necessary to increase the signal multiplication factor so as to obtain a predetermined S/N ratio. Therefore, it is necessary to increase the Gb product to more than 100 GHz. To increase the GB product, it is effective to decrease the total film thickness (Lt) of the superlattice layer. When Lt decreases, however, the electric field necessary to obtain a certain multiplication increases and the ionization rate ratio k decreases resultantly.

Therefore, it is impossible to improve the aforementioned characteristics by the method of decreasing Lt with the conventional superlattice structure. Furthermore in the SLAPD, positive holes with a heavy effective mass are stored on the heterojunction interface, so that the response characteristics are degraded. Therefore, it is necessary to realize a superlattice structure which produces no storage effect.

SUMMARY OF THE INVENTION

The present invention provides an avalanche photodiode having a high ionization rate ratio and a high gain-bandwidth product which is free from the problems inherent in the aforementioned prior art.

To achieve these characteristics, the present invention provides an avalanche photodiode wherein a multiplication layer is formed by a structure that two or more types of semiconductor layers with a different band gap are laminated, that is, by a superlattice structure, and a tensile stress is applied to semiconductor layers having the maximum band gap of the superlattice structure, that is, to barrier layers.

The characteristics of electrons can be controlled by applying a strain to the superlattice structure. As described later, such a superlattice structure increases the ionization rate ratio and prevents storage of positive holes so as to realize a high GB product.

A guide for improving the ionization rate ratio is as follows: To realize ionization, it is necessary to accelerate the kinetic energy of electrons or positive holes to more than a threshold value. For this acceleration, the acceleration by the normal electric field and also an adiabatic acceleration using the potential energy difference at the hetero crystalline interface are effective. In FIG. 1, the potential energy difference sensed by electrons corresponds to discontinuity $\Delta Ec$ of a conduction band 53 and the potential energy difference sensed by positive holes corresponds to discontinuity $\Delta Ev$ of a valence band 54.

When an inequality $\Delta Ec > \Delta Ev$ is held, the electron ionization rat $\alpha$ can be increased more than hole ionization rate $\beta$ and the ionization rate ratio can be improved.

Next, a mechanism for improving the ionization rate ratio by the present invention will be described with reference to the schematic energy band structure of the multiplication layer shown in FIG. 1. Band discontinuity $\Delta Ec$ and $\Delta Ev$ are originally intrinsic values of the crystal material. However, they can be effectively changed by applying a tensile stress to barrier layers 52. When a sample with a tensile stress applied is compared with a sample of the same composition with no tensile stress applied, the energy level Ev (1 h) of light holes (LH) in the valence band approaches the conduction band side. A symbol HH indicates the energy level of heavy holes. When Ev (1 h) almost coincides with the end of the valence band of semiconductor layers with the minimum band gap, that is, well layers 51 by controlling the stress value, most accelerated positive holes pass through the multiplication layer without sensing $\Delta Ev$. Therefore, the ionization coefficient $\beta$ of positive holes can be decrease. Since the change of $\Delta Ec$ of electrons is small, the change of $\alpha$ caused by the applied stress is also small. Therefore, the ionization rate ratio $k = \alpha/\beta$ increases and a desired effect is obtained.

According to the structure of the present invention, the barrier $\Delta Ec$ for the light holes (LH) with low potential energy becomes approximately zero and the positive hole storage effect on the heterojunction interface is eliminated. As a result, there is an advantage that a reduction in available bandwidth particularly in a low bias area can be prevented.

It is desirable to set the tensile stress to be applied to the barrier layers so that the tensile strain ranges from 0.1% to 3.5%. When the tensile strain is less than 0.1%, the application of tensile strain is little effective. When the tensile strain is more than 3.5%, a dislocation occurs undesirably.

It is desirable to set the thickness of the barrier layers constituting the multiplication layer between 5 nm and 30 nm. When the thickness of each barrier layer is less than 5 nm, electrons move between the well layers by the tunnel phenomenon and it is undesirably difficult to accelerate them. When each barrier layer is unnecessarily thick, the total film thickness of the multiplication layer increases and the GB characteristics are degraded undesirably. Therefore, it is generally desirable to keep the barrier layer thickness at most 30 nm.

It is desirable to set the thickness of each well layer constituting the multiplication layer between 2 and 20 nm. Electrons accelerated at the heterojunction interface go ahead through the well layers by losing the energy by the phonon scattering. When the well layer thickness is more than 20 nm, the energy is almost relaxed and any effect of improving the ionization rate ratio due to the existence of a hetero barrier cannot be obtained. When the well layer thickness is less than 2 nm, the quantum level rises excessively by the quantum size effect, and the ionization threshold energy increases, and the ionization rate ratio decreases. Both cases are not desirable. The total thickness of the multiplication layer is set to 0.1 μm to 0.5 μm. When the total thickness of the multiplication layer is excessively thin, the electric field intensity for acquiring a predetermined gain increases, and hence the dark current increase, and the ionization rate ratio decreases to about 1 undesirably. When the total thickness of the multiplication layer is excessively thick, the running time of carriers passing through the multiplication layer, that is multiplication buildup time increases and the GB product characteristics are degraded undesirably. Therefore, it is desirable to set the total thickness of the multiplication layer within the above limits.

The multiplication layers are generally laminated with barrier layers and well layers. However, well-known intermediate layers such as graded layers may be inserted between each barrier layer and the neighbouring well layer. Those intermediate layers are effective to prevent carriers from piling up on the interfaces between the well layers and barrier layers.

By selecting a combination of materials so that the lattice constant of the barrier layers of the superlattice layer which forms the multiplication layer is smaller than the lattice constant of the well layers, a tensile stress can be applied to the barrier layers. Concretely, it is desirable to make the lattice constant of the barrier layers smaller than the lattice constant of the substrate crystal by 0.1 to 3.5% and to set the difference between the mean lattice constant of the entire multiplication layer and the lattice constant of the substrate crystal to at most 0.2%. By doing this, when the thicknesses of barrier and well layer are the same, the lattice constant of the barrier layers is generally smaller than the lattice constant of the well layers by 0.1 to 7%. When the lattice constant of the barrier layers is below the lower limit, the effect of application of tensile stress is insufficient. When the lattice constant of the barrier layers is above the upper limit, the characteristics are degraded due to an occurrence of dislocation. Therefore, both cases are not desirable.

As mentioned above, the thickness of the multiplication layer with favorable characteristics ranges from 0.1 μm to 0.5 μm. To prevent the multiplication layer from an occurrence of dislocation in this case, it is necessary to set the difference between the mean lattice constant of the multiplication layer and the lattice constant of the substrate crystal to at most 0.2%. When dislocations occur in the multiplication layer, the dark current of the photodiode increases undesirably.

Furthermore, as mentioned above, by applying a tensile stress to the barrier layers, it is possible to make $\Delta Ec$ larger than $\Delta Ev$ so as to increase the ionization rate ratio k. When a tensile stress is applied to the barrier layers so that the strain ranges from 0.1% to 3.5%, $\Delta Ec$ can be made larger than $\Delta Ev$ by 0.3 to 0.9 eV in the case of InGaAs/InAlAs system.

As the ionization rate ratio k increases, noise reduces and the response speed increases. Therefore, it is desirable that the ionization rate ratio k is higher, that is, more than or equal to 3. Furthermore, the GB product also increases in proportion to the ionization rate ratio k. Therefore, it is desirable also from this point of view that the ionization rate ratio k is high.

For an optical signal receiver of high speed communication such as 10 Gb/s, it is necessary to make the band of the preamplifier thereof wider. As a result, the noise power increases and it is necessary to increase the multiplication to about 10 times so as to obtain a required SN ratio. Therefore, the photodiode of the present invention requires a GB product of more than 100. The avalanche photodiode (APD) of the present invention comprises a first buffer layer, a multiplication layer, an electric field relaxation layer for adjusting the electric fields of a light absorbing layer and the multiplication layer, a light absorbing layer, a second buffer layer, and a contact layer which are laminated on the substrate and furthermore required electrodes. The conventional APD structure may be used except that the lattice constant of barrier layers of the superlattice layer constituting the multiplication layer is made smaller than the lattice constant of the crystalline substrate by 0.1% to 3.5% so that a tensile stress is applied to the barrier layers. When an InP system material is used for the substrate crystal, an InGaAs or InGaAsP system material may be used for the light absorbing layer, an InAlAs, InGaAs, InGaAlAs, InP, or InGaAsP system material for the electric field relaxation layer, an InGaAs, InGaAlAs or InGaAsP system material for the well layers of the multiplication layer, an InAlAs, InP, InGaAlAs or InGaAsP system material for the barrier layers of the multiplication layer, an InAlAs, InP, InGaAlAs or InGaAsP system material for the first and second buffer layers, and an InGaAs or InGaAsP system material for the contact layer. When intermediate layers are used as pileup preventive layers, an InAlGaAs or InGaAsP system material is used for them.

Furthermore, other layers may be added to the above layers as required.

DETAILED DESCRIPTION

Figure 1:
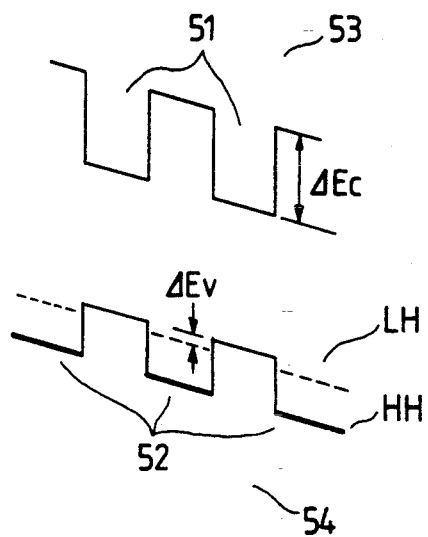
FIG. 1 shows the schematic energy band structure of a strained superlattice which is possessed by the superlattice avalanche photodiode of the present invention.
Figure 2:
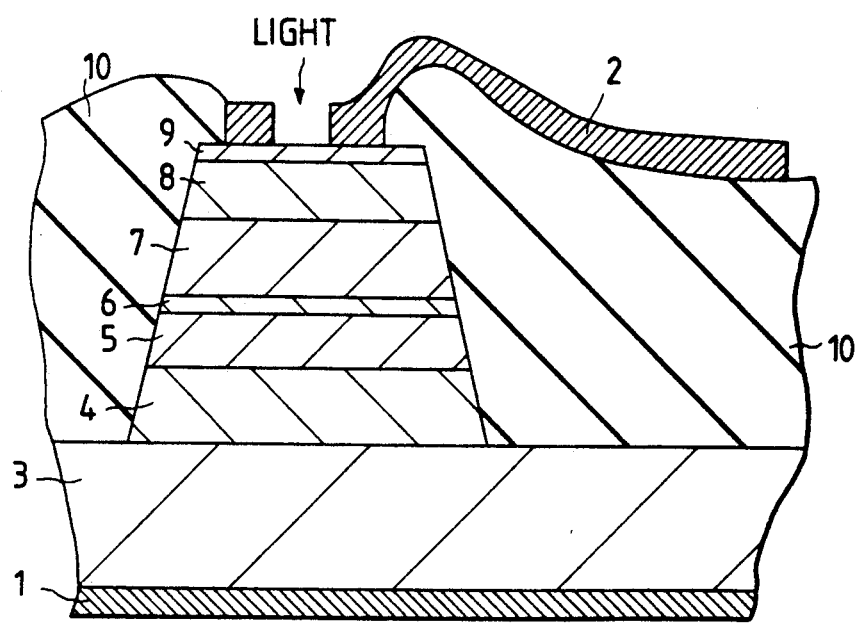
FIG. 2 is a sectional view of a superlattice avalanche photodiode of an embodiment of the present invention.

FIG. 2 shows a sectional view of the superlattice APD of a first embodiment of the present invention. This photodiode is a mesa type APD wherein the light absorbing layer 7 and the multiplication layer 5 having a superlattice structure are separated. The superlattice multiplication layer 5 which is a characteristic of the present invention comprises InGaAs well layers 51 with a thickness Lw of 10 nm and InAlAs barrier layers 52 with a thickness Lb of 10 nm and the total film thickness of the superlattice multiplication layer 5 is 0.35 μm. In this case, the Al composition ratio x of the $In_{1-x}Al_xAs$ barrier layers is set to 0.65 to 0.75 so that the lattice constant thereof is smaller than the lattice matching value with InP by 1 to 2%. By doing this, the barrier layers are put into a state that a tensile stress is applied. For the $In_{1-y}Ga_yAs$ well layers, by setting the Ga composition ratio y to 0.2 to 0.3 so that the lattice constant thereof is larger than the lattice matching value with InP by 1 to 2%, the mean lattice constant of the entire superlattice multiplication layer coincides with the lattice constant of the InP crystal within a tolerance of 0.2% so as to prevent an occurrence of dislocation.

In FIG. 2, numeral 1 denotes an N electrode, 2 a P electrode, 3 an N-InP substrate (film thickness d = 150 μm and carrier density $N = 2 \times 10^{18}/cm^3$), 4 an N-InAlAs buffer layer ($d = 1$ μm and $N = 2 \times 10^{18}/cm^3$), 5 an undoped superlattice multiplication layer ($d = 0.35$ μm and $N < 1 \times 10^{15}/cm^3$), 6 a P-INAlAs electric field relaxation layer ($d = 0.2$ μm and $P = 1.3 \times 10^{17}/cm^3$), 7 a P-InGaAs light absorbing layer ($d = 1.7$ μm and $P = 2 \times 10^{15}/cm^3$), 8 a P-InAlAs buffer layer ($d = 1$ μm and $P = 2 \times 10^{18}/cm^3$), 9 a P-InGaAs contact layer ($d = 0.2$ μl and $P = 2 \times 10^{19}/cm^3$), and 10 a polyimide passivation film. The junction diameter is 50 μm. The composition, lattice constant, and strain of the well layers, barrier layers, and substrate of this embodiment are as follows:

|  | Composition | Lattice constant | Strain |
|---|---|---|---|
| Well layer | $In_{0.75}Ga_{0.25}As$ | 5.957 Å | +1.50% |
| Barrier layer | $In_{0.3}Al_{0.7}As$ | 5.779 Å | −1.53% |
| Substrate | InP | 5.869 Å | |

Furthermore, the mean strain of the multiplication layer is −0.017%.

The molecular beam epitaxy method is used for crystal growth of this photodiode and the wet etching method by a Br system solution is used to form a mesa shape. The triple layers of Au/Pt/Ti formed by the electron beam deposition method are used for both P-type and N-type electrodes.

The characteristics of the superlattice avalanche photodiode (SLAPD) of this embodiment using the above structure are indicated below. The dark current Id, photodiode capacity C, electron ionization coefficient α, positive hole ionization coefficient β, ionization rate ratio k, ΔEc, and ΔEv when the multiplication factor M is 10 are 800 nA, 0.13 pF, $5.27 \times 10^4$, $5.27 \times 10^3$, 10, 1.0 eV, and 0.4 eV respectively. Furthermore, to set the multiplication factor M to 10, the bias voltage to be applied to the photodiode is 28 V. M can be generally adjusted by the bias voltage.

The quantum efficiency η at an incident light wave length of 1.55 μm if 85%. When the frequency characteristic of this photodiode is evaluated by a spectrum analyzer, a gain-bandwidth product is 105 GHz and the cut-off frequency fc obtained at a multiplication factor of 10 is 10 GHz.

The receiver sensitivity is obtained from the transmission experiment using this photodiode. A distributed feedback (DFB) laser with an oscillating wave length of 1.55 μm is used as a light source and a minimum receiver sensitivity of −28 dBm is obtained at an optical fiber length of 100 km and a bit error rate of $10^{-11}$.

As mentioned above, the present invention relates to the superlattice structure of the superlattice APD, and it is needless to say that the present invention is not restricted to the photodiode structure (i.e. the specifications of the mesa type structure, the rear side incidence system, and the layers other than the superlattice multiplication layer) shown in this embodiment of the present invention.

REFERENCE EXAMPLE 1

A SLAPD which is the same as the SLAPD shown in Embodiment 1 except that the well layers of the multiplication layer are composed of $In_{0.53}Ga_{0.47}As$ and the barrier layers are composed of $In_{0.52}Al_{0.48}As$ and the carrier density of the electric field relaxation layer is $1.7 \times 10^{17}/cm^3$ is produced and the characteristics thereof are measured. As a result, the dark current Id is 500 nA, the photodiode capacity C is 0.13 pF, the ionization rate ratio k is 5, the quantum efficiency η is 85%, the GB product is 77 GHz, the cut-off frequency fc is 8 GHz, and the bias voltage applied to the photodiode for obtaining the multiplication factor M of 10 is 35 V.

In this more conventional SLAPD, as mentioned above, the GB product reduces from 105 GHz to 77 GHz and the ionization rate ratio k reduces from 10 to 5 compared with Embodiment 1, and the obtained characteristics are insufficient.

Figure 3:
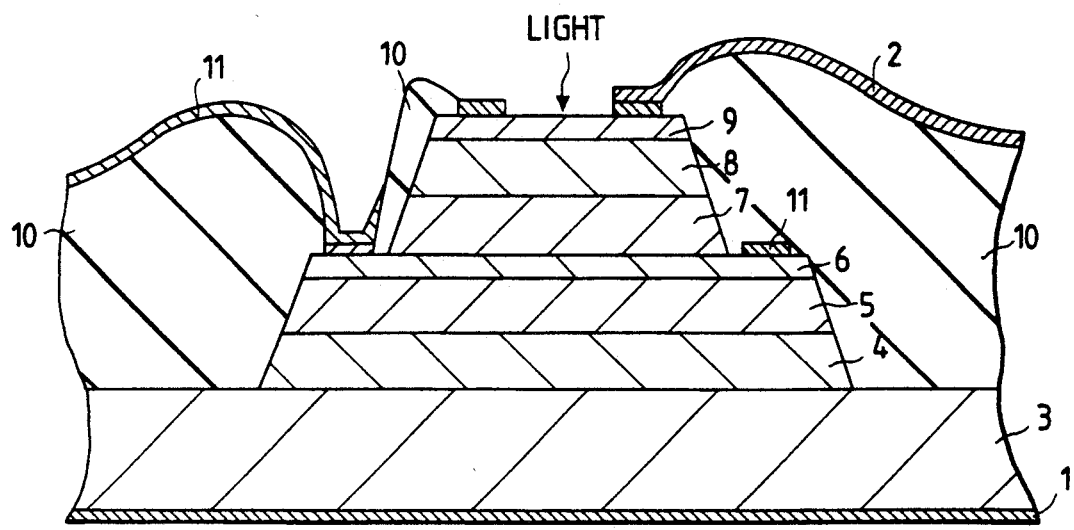
FIG. 3 is a sectional view of a superlattice avalanche photodiode of another embodiment of the present invention.

The SLAPD in the first embodiment has two electrodes such as an N electrode and a P electrode. In another embodiment, shown in the sectional view in FIG. 3, a structure having three electrodes including a ring electrode 11 installed in an electric field relaxation layer 6 may be used. By using the ring electrode, the band characteristics of the SLAPD can be improved.

Figure 4:
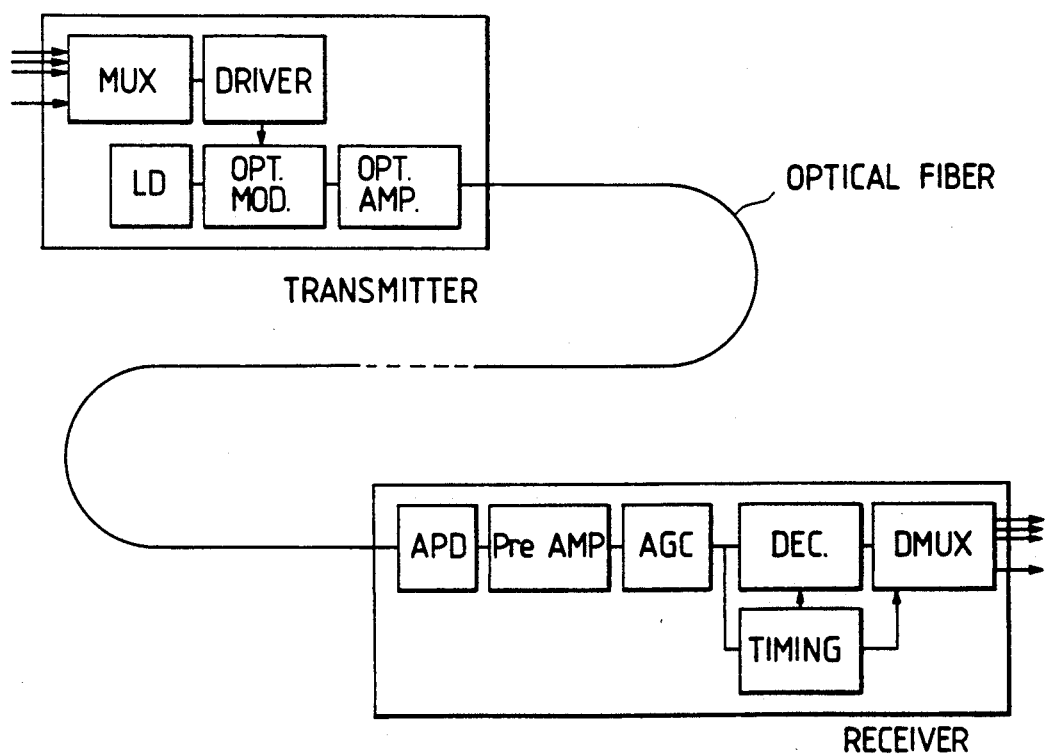
FIG. 4 is a block diagram showing a transmitting and receiving system with a structure using the superlattice avalanche photodiode of the present invention as a front end of the receiver.

The SLAPD of the present invention is a photodiode having wide band and low noise characteristics and can be used for various purpose in the optical communication. A third embodiment relates to the receiver of a 10-Gb/S transmission system which is a typical use thereof. FIG. 4 is a schematic block diagram for explaining the light transmission system of this embodiment. The SLAPD of the present invention is used at the front end of the receiver. The transmitter converts parallel data of 622 Mb/s × 16 to a 10-Gb/s signal by a multiplexer. The lithium niobate MachZehnder light modulator is driven by this signal and a 10 Gb/s intensity modulation signal beam (wave length 1.55 μm) is obtained. The beam is amplified and used to a mean output of 0 to 10 dBm by the optical fiber amplifier. The receiver uses the SL-APD of the present invention at the front end, and amplifies the received signal by the preamplifier, and obtains a 10-Gb/s signal by the AGC circuit (automatic gain control circuit), decision circuit, and timing extracting circuit, and then obtains a parallel signal of 622 Mb/s × 16 by the demultiplexer. The fiber length between the transmitter and receiver which is used for the experiment is 80 km. An attenuator is inserted immediately prior to the SL-APD and the received light level is changed to evaluate the minimum reception sensitivity. The mean reception level at an error rate of 10-11 is −25 dBm or less. It becomes apparent that when the mean output of the transmitter is more than 5 dBm, a sufficient transmission margin can be reserved and the applicability of a wide band transmission system using the SL-APD as an optical front end can be confirmed. A reception system applying the SL-APD requires no optical amplifier for the receiver and hence the SL-APD is effective particularly on system miniaturization and low power consumption. As mentioned above, the present invention provides a superlattice avalanche photodiode with a wide bandwidth and low noise for high speed optical communication. Concretely, a high gain-bandwidth product can be realized while keeping a high ionization rate ratio.

What is claimed is:

1. An avalanche photodiode having a multiplication layer, a light absorbing layer and a crystalline substrate, said multiplication layer comprising superlattice layers having a structure in which at least two types of semiconductors with different band gaps are laminated, wherein a tensile stress is applied to barrier layers among said superlattice layers.

2. An avalanche photodiode according to claim 1, wherein a lattice constant of the barrier layers among said superlattice layers is smaller than a lattice constant of well layers among said superlattice layers.

3. An avalanche photodiode according to claim 2, wherein a difference between a mean lattice constant of said multiplication layer and a lattice constant of the crystalline substrate is not more than 0.2%.

4. An avalanche photodiode according to claim 1, wherein said light absorbing layer is mounted over said multiplication layer, and an electric field relaxation layer is arranged between said multiplication layer and said light absorbing layer, and further including at least two electrodes for applying an electric field to said light absorbing layer, said electric field relaxation layer, and said multiplication layer.

5. An avalanche photodiode wherein a first buffer layer, a multiplication layer, an electric field relaxation layer, a light absorbing layer, a second buffer layer, and a contact layer are laminated on a crystalline substrate in this order, and said multiplication layer comprises superlattice layers having a structure in which at least two types of semiconductors with different band gaps are laminated, and a lattice constant of barrier layers of said superlattice layers is smaller than a lattice constant of the crystalline substrate by 0.1% to 3.5%, and the difference between a mean lattice constant of said multiplication layer and the lattice constant of the crystalline substrate is not more than 0.2%.

6. An avalanche photodiode according to claim 5, wherein semiconductor materials constituting said crystalline substrate, said first and second buffer layers, well layers of said multiplication layer, said barrier layers of said multiplication layer, said electric field relaxation layer, said light absorbing layer, and a contact layer are composed of an InP system; a semiconductor system selected from a group consisting of an INAlAs system, an InP system, an InGaAsP system; a semiconductor system selected from a group consisting of an InGaAs system and an InGaAsP system; a semiconductor system selected from a group consisting of an InAlAs system, an InGaAlAs system, an InP system, and an InGaAsP system; a semiconductor system selected from a group consisting of an InAlAs system, an InGaAs system, an InP system, and an InGaAsP system; a semiconductor system selected from a group consisting of an InGaAs system and an InGaAsP system; and a semiconductor system selected from a group consisting of an InGaAs system and an InGaAsP system, respectively.

7. A front end receiver in a light transmission system comprising a transmitter and a receiver, wherein the front end of said receiver has an avalanche photodiode which has a multiplication layer and a light absorbing layer, said multiplication layer comprising superlattice layers having a structure in which at least two types of semiconductors with different band gaps are laminated, and wherein a tensile stress is applied to barrier layers among said superlattice layers.

* * * * *

UNITED STATES PATENT AND TRADEMARK OFFICE
CERTIFICATE OF CORRECTION

PATENT NO. : 5,308,995
DATED : May 3, 1994
INVENTOR(S) : Tsuji Shinji et al

It is certified that error appears in the above-indentified patent and that said Letters Patent is hereby corrected as shown below:

```
Column 1, line 12, after "As" change "s" to --a --.
          line 18, change "lattice" to --lattices --.
Column 2, line 25, change  "rat"  to --rate --.
          line 47, change "decrease." to --decreased. --
Column 3, line 22, change "increase," to --increased, --.
Column 5, line 22, change "P-INAlAs" to P-InAlAs --.
          line 60, change "if" to --is--.
```

Signed and Sealed this

Sixth Day of September, 1994

Attest:

BRUCE LEHMAN

*Attesting Officer*    *Commissioner of Patents and Trademarks*

UNITED STATES PATENT AND TRADEMARK OFFICE
CERTIFICATE OF CORRECTION

PATENT NO. : 5,308,995
DATED : May 3, 1994
INVENTOR(S) : Tsuji Shinji, et. al.

It is certified that error appears in the above-indentified patent and that said Letters Patent is hereby corrected as shown below:

```
Column 1, line 12, after "As" change "s" to --a--.
Column 1, line 18, change "lattice" to --lattices--.
Column 2, line 25, change "rat" to --rate--.
Column 2, line 47, change "decrease." to --decreased.--
Column 3, line 22, change "increase, " to --increases,--.
Column 5, line 22, change "P-INAlAs" to --P-InAlAs--.
Column 5, line 60, change "if" to --is--.
```

This certificate supersedes Certificate of Correction issued September 6, 1994.

Signed and Sealed this

Twentieth Day of September, 1994

Attest:

BRUCE LEHMAN

Attesting Officer

Commissioner of Patents and Trademarks